(12) United States Patent
Yamamoto et al.

(10) Patent No.: US 7,884,443 B2
(45) Date of Patent: Feb. 8, 2011

(54) SEMICONDUCTOR DEVICE HAVING A MOUNTING SUBSTRATE WITH A CAPACITOR INTERPOSED THEREBETWEEN

(75) Inventors: Kenichi Yamamoto, Osaka (JP); Daisuke Suetsugu, Osaka (JP); Daido Komyoji, Nara (JP)

(73) Assignee: Panasonic Corporation, Osaka (JP)

( * ) Notice: Subject to any disclaimer, the term of this patent is extended or adjusted under 35 U.S.C. 154(b) by 564 days.

(21) Appl. No.: 11/993,781

(22) PCT Filed: Aug. 9, 2006

(86) PCT No.: PCT/JP2006/315708
§ 371 (c)(1),
(2), (4) Date: Dec. 21, 2007

(87) PCT Pub. No.: WO2007/029445
PCT Pub. Date: Mar. 15, 2007

(65) Prior Publication Data
US 2010/0148302 A1 Jun. 17, 2010

(30) Foreign Application Priority Data
Sep. 6, 2005 (JP) ............... 2005-257290

(51) Int. Cl.
*H01L 29/92* (2006.01)
(52) U.S. Cl. .................................... 257/531
(58) Field of Classification Search ............. 257/531
See application file for complete search history.

(56) References Cited

U.S. PATENT DOCUMENTS
2005/0200003 A1   9/2005   Yoon et al.

FOREIGN PATENT DOCUMENTS

| JP | 63-4662 | 1/1988 |
| JP | 5-267557 | 10/1993 |
| JP | 5-267557 A | 10/1993 |
| JP | 10-93002 | 4/1998 |
| JP | 2000-208669 | 7/2000 |
| JP | 2001-326305 | 11/2001 |
| JP | 2003-142624 | 5/2003 |
| JP | 2004-55769 | 2/2004 |
| JP | 2005-203775 | 7/2005 |

OTHER PUBLICATIONS

Chinese Office Action issued in Chinese Patent Application No. CN 2006800280398 dated Apr. 3, 2009.

*Primary Examiner*—Thomas L Dickey
(74) *Attorney, Agent, or Firm*—McDermott Will & Emery LLP

(57) ABSTRACT

A capacitor-equipped semiconductor device includes a semiconductor chip having a plurality of electrode terminals; a sheet-like substrate at least having a film capacitor; and a mounting substrate. The mounting substrate is provided on one side thereof with chip connection terminals and ground terminals. The chip connection terminals are disposed to correspond to the electrode terminals of the semiconductor chip. The ground terminals are disposed to correspond to the one electrode terminals of the film capacitor of the sheet-like substrate. The mounting substrate is provided on the other side thereof with external connection terminals connected to the chip connection terminals and the ground terminals and used to mount the mounting substrate on an external substrate.

9 Claims, 11 Drawing Sheets

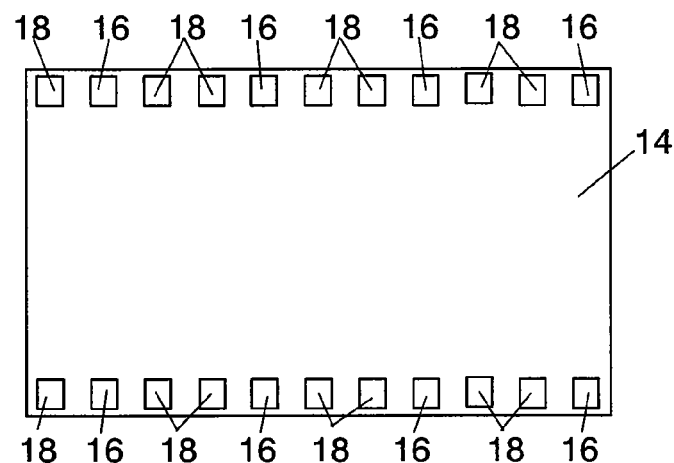
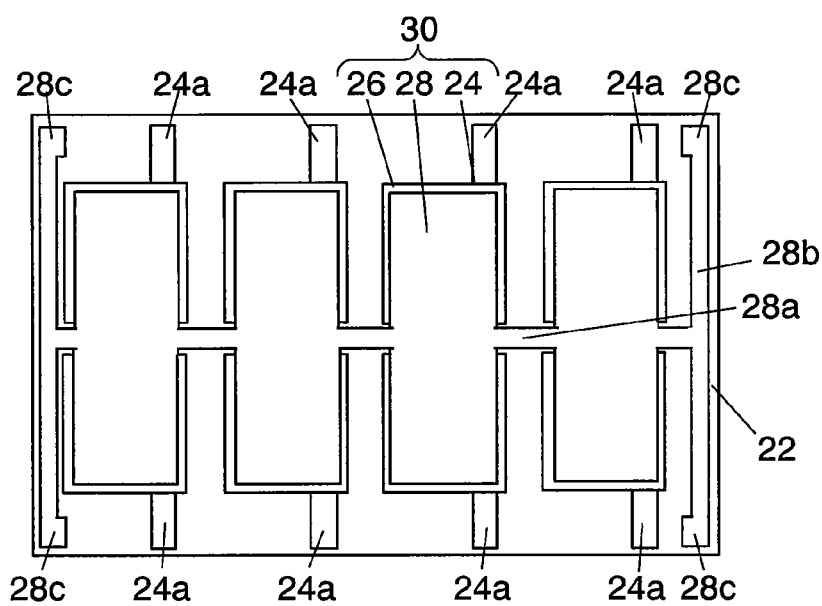
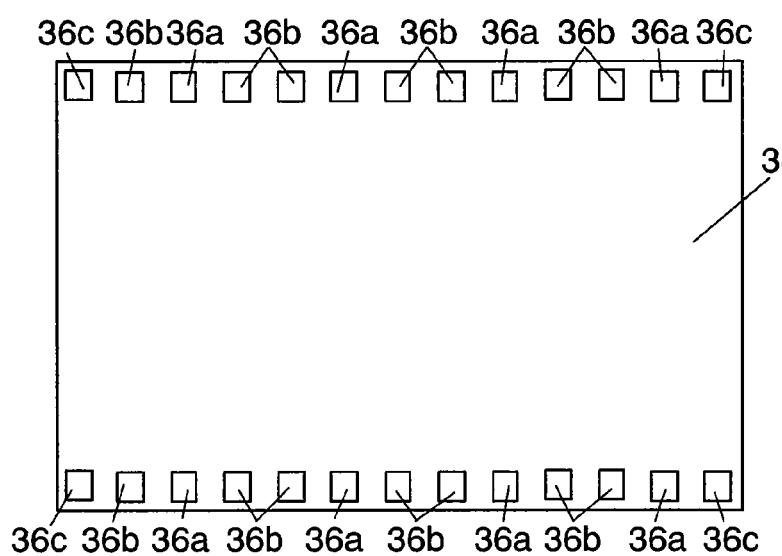

SEMICONDUCTOR DEVICE HAVING A MOUNTING SUBSTRATE WITH A CAPACITOR INTERPOSED THEREBETWEEN

RELATED APPLICATIONS

This application is the U.S. National Phase under 35 U.S.C. §371 of International Application No. PCT/JP2006/315708, filed on Aug. 9, 2006, which in turn claims the benefit of Japanese Application No. 2005-257290, filed on Sep. 6, 2005, the disclosures of which Applications are incorporated by reference herein.

TECHNICAL FIELD

The present invention relates to a capacitor-equipped semiconductor device which has a noise reduction capacitor integrated into the package.

BACKGROUND ART

Conventionally, in a semiconductor device having a semiconductor chip mounted on a mounting substrate, a chip capacitor for noise reduction is attached to a circuit board on which the semiconductor device is mounted. However, attaching the chip capacitor to the circuit board requires a long wire length between the semiconductor chip and the chip capacitor. This reduces the noise absorbing performance and hence degrades the performance as a decoupling capacitor. This also prevents the miniaturization of the semiconductor device as a whole including the chip capacitor.

To solve these problems, it has been tried to miniaturize semiconductor devices by providing an interposer with a built-in capacitor or by interposing an element having a capacitor function between the mounting substrate and a semiconductor chip.

For example, Japanese Patent Unexamined Publication No. 2001-326305 (hereinafter, Patent Document 1) discloses the following structure.

In Patent Document 1, an interposer is provided with capacitors on a surface thereof that is opposite to the surface having protruding electrodes thereon. This structure enables the capacitors integrated into the interposer to be disposed right under the semiconductor chip, making it possible to fully function as the decoupling capacitors. It is also possible to produce the plurality of capacitors at the same time as the interposer, making the production cost low.

Japanese Patent Unexamined Publication No. 2003-142624 (hereinafter, Patent Document 2) discloses a method for producing an interposer with built-in passive elements such as a bypass capacitor. The method includes a process of forming an interposer with built-in passive elements on a base substrate; a process of mounting at least one semiconductor chip on the interposer formed on the base substrate; a process of separating the base substrate from the interposer so as to expose the other surface of the interposer; and a process of mounting the interposer on a mounting substrate via an electrode pad exposed on the other surface of the interposer.

In this production method, the interposer is fixed to the base substrate until the semiconductor chip is mounted on the interposer, so that the interposer is reinforced by the base substrate. Even after the base substrate is removed, the semiconductor chip mounted on the interposer performs the reinforcement function. This provides a thin interposer with a built-in bypass capacitor while preventing the interposer from deformation or damage during the production process.

Japanese Patent Unexamined Publication No. 2004-55769 (hereinafter, Patent Document 3) discloses a semiconductor device including a mounting substrate; a semiconductor chip mounted thereon; and a capacitor allowing the semiconductor chip to operate stably at a high frequency range. The capacitor is electrically connected to an electrode pad disposed on the bottom surface of the semiconductor chip. The substrate having the capacitor thereon has a thickness equal to or less than the height of the protruding electrodes of the semiconductor chip. The capacitor is formed on the smooth surface of the substrate made of silicon, glass, or the like. The capacitor is polished from the substrate side so as to make the thickness of the substrate equal to or less than the height of the protruding electrodes when the semiconductor chip is mounted on the mounting substrate. This results in the minimization of the wire length between the semiconductor chip and the capacitor.

In Patent Document 1, the capacitors are produced at the same time as the interposer. The capacitors are made of STO (strontium titanium oxide) or the like.

STO, however, needs to be made at comparatively high temperatures in order to obtain good dielectric properties and also requires that the insulation base material has a smooth surface. This makes it necessary that the insulation base material is made not of resin base material generally used for printed-circuit boards, but of silicon, glass, polyimide resin, or the like. Moreover, forming the capacitors, throughholes, wiring patterns, and the like on the insulation base material makes the production process complicated and makes it difficult to obtain a high yield.

In Patent Document 2, on the other hand, the interposer with the built-in capacitor is formed on the base substrate, and the semiconductor chip is mounted on the interposer. After this, the interposer from which the base substrate has been removed is mounted on the mounting substrate. Thus, the interposer needs to have the capacitor in addition to throughholes and wiring patterns required for the interposer. To achieve this structure, the base substrate is made of a silicon substrate, and the dielectric film for the capacitor is made of a BST film (a barium strontium titanium oxide film). As a result, the interposer of Patent Document 2 also requires a complicated production process and the yield is low.

In Patent Documents 1 and 2, the capacitors are built in the interposer; however, the process of producing the interposer is so complicated that the yield is low, making it impossible to produce the interposer at low cost.

In Patent Document 3, on the other hand, the thin film capacitor is interposed between the semiconductor chip and the mounting substrate. In other word, the substrate having the thin film capacitor only thereon is interposed between the semiconductor chip and the mounting substrate, thereby simplifying the production process.

Since, however, the thin film capacitor is formed on a silicon substrate or a glass substrate, it is necessary to precisely control the height of the protruding electrodes of the semiconductor chip and the thickness of the silicon substrate on which to form the thin film capacitor. When the silicon substrate on which to form the thin film capacitor is thick, the semiconductor chip may be damaged at the surface having a circuit thereon when a force is applied during flip-chip mounting. Moreover, it is difficult to securely fill underfill resin between the semiconductor chip and the mounting substrate, thereby deteriorating the reliability.

SUMMARY OF THE INVENTION

The capacitor-equipped semiconductor device of the present invention includes a semiconductor chip having a plurality of electrode terminals; a sheet-like substrate having a film capacitor; a mounting substrate provided on one side thereof with chip connection terminals disposed to correspond to the electrode terminals of the semiconductor chip and a ground terminal disposed to correspond to one electrode terminal of the film capacitor of the sheet-like substrate, the mounting substrate being provided on the other surface thereof with an external connection terminal connected to the chip connection terminals and the ground terminal and used to mount the mounting substrate on an external substrate. The sheet-like substrate is interposed between the semiconductor chip and the mounting substrate. The electrode terminals of the semiconductor chip are connected to the chip connection terminals. The one electrode terminal of the film capacitor is connected to the ground terminal. The other electrode terminal is connected to a predetermined electrode terminal of the electrode terminals of the semiconductor chip.

In this structure where the sheet-like substrate having a capacitor is interposed between the semiconductor chip and the mounting substrate, the height of the semiconductor device can be the same as in the conventional structures. This results in a slim and compact semiconductor device with a built-in capacitor for noise prevention.

Furthermore, the sheet-like substrate having the film capacitor thereon is produced separately from the mounting substrate, thereby providing a simple production process simple and a high yield. These components can be inspected to use only the non-defective ones so as to improve the yield of the semiconductor device, thereby producing inexpensive semiconductor devices.

BRIEF DESCRIPTION OF THE DRAWINGS

FIG. 2A is a plan view of a semiconductor chip, which is a component of the capacitor-equipped semiconductor device according to the first exemplary embodiment of the present invention.

FIG. 2B is a plan view of a sheet-like substrate, which is a component of the capacitor-equipped semiconductor device according to the first exemplary embodiment of the present invention.

FIG. 2C is a plan view of a mounting substrate, which is a component of the capacitor-equipped semiconductor device according to the first exemplary embodiment of the present invention.

Figure 1A:
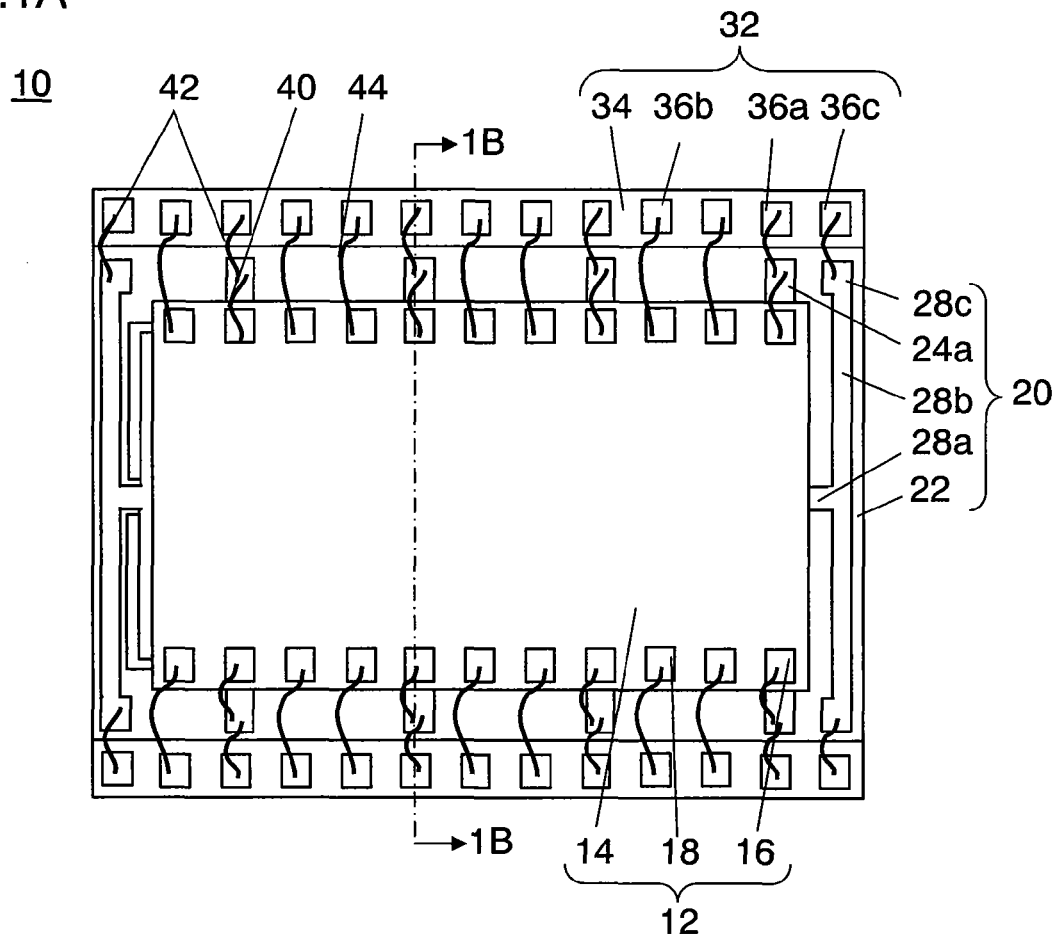
FIG. 1A is a plan view of a capacitor-equipped semiconductor device according to a first exemplary embodiment of the present invention when seen from the semiconductor chip side in a state without encapsulating resin.

REFERENCE MARKS IN THE DRAWINGS 10, 50, 90 capacitor-equipped semiconductor device
12, 52, 92 semiconductor chip
14, 54 silicon substrate
16, 18, 56, 58, 60, 95, 96, 97 electrode terminal
20, 64, 100, 140, 160 sheet-like substrate
22, 66, 102 sheet base material
24, 68, 104 lower electrode film
24a, 68a, 104a the other group of electrode terminals
24d via hole
26, 72, 106 dielectric film
28, 74, 108 upper electrode film
28a common connection portion
28b extension portion
28c, 74a, 108a one group of electrode terminals
30, 76, 110 film capacitor
32, 80, 120 mounting substrate base material
36a, 36b, 84, 124 chip connection terminal
36c, 89, 125 ground terminal
38, 86, 126 external connection terminal
39, 62, 88, 98, 128 protruding electrode
40, 42, 44 wire lead
46 encapsulating resin
70, 112 through-hole
78 dummy terminal
130 conductive connecting member
132 underfill resin
150 film inductor
150a, 170a first electrode terminal
150b, 170b second electrode terminal
170 film resistor

DETAILED DESCRIPTION OF PREFERRED EMBODIMENTS

Exemplary embodiments of the present invention are described as follows with reference to drawings. In the drawings, the same elements are referred to with the same reference numerals and the description may be omitted.

First Exemplary Embodiment

Figure 1B:
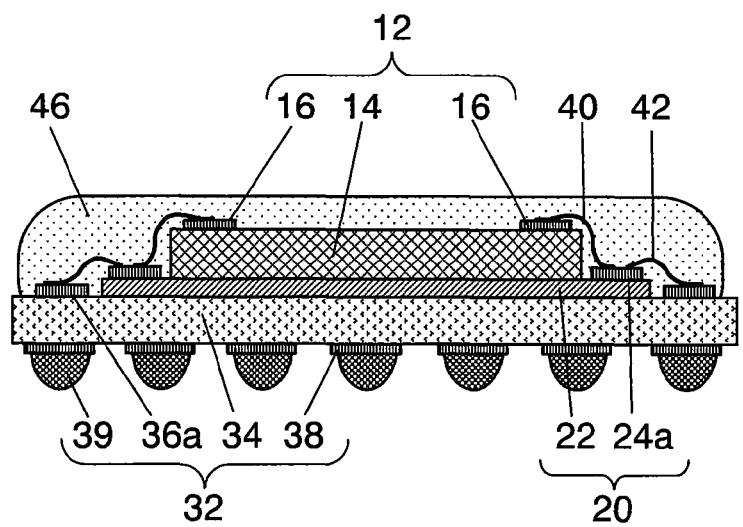
FIG. 1B is a sectional view of the capacitor-equipped semiconductor device according to the first exemplary embodiment of the present invention taken along line 1B-1B of FIG. 1A in a state with the encapsulating resin.

FIG. 1A is a plan view of a capacitor-equipped semiconductor device according to a first exemplary embodiment of the present invention when seen from the semiconductor chip side in a state without encapsulating resin. FIG. 1B is a sectional view taken along line 1B-1B of FIG. 1A.

FIGS. 2A to 2C are plan views of semiconductor chip 12, sheet-like substrate 20, and mounting substrate 32, respectively, which are components of capacitor-equipped semiconductor device 10. FIG. 2A shows the semiconductor chip, FIG. 2B shows the sheet-like substrate, and FIG. 2C shows the mounting substrate.

Capacitor-equipped semiconductor device 10 of the present exemplary embodiment includes semiconductor chip 12, sheet-like substrate 20, and mounting substrate 32. Semiconductor chip 12 has a plurality of electrode terminals 16 and 18. Sheet-like substrate 20 has a plurality of film capacitors 30 formed by film forming technique. Mounting substrate 32 having external connection terminals 38 via which mounting substrate 32 is mounted on an external substrate. Mounting substrate 32 is provided on one side thereof with chip connection terminals 36a, 36b and ground terminals 36c. Chip connection terminals 36a and 36b are connected and correspond to electrode terminals 16 and 18, respectively, of semiconductor chip 12. Ground terminals 36c are connected and correspond to one group of electrode terminals 28c of film capacitors 30 of sheet-like substrate 20. Mounting substrate 32 is provided on the other side thereof with external connection terminals 38 connected to chip connection terminals 36a, 36b and ground terminals 36c on the opposite surface. Mounting substrate 32 is mounted on the external substrate via external connection terminals 38. Mounting substrate 32 is also provided with protruding electrodes 39 on external connection terminals 38.

Sheet-like substrate 20 is interposed between semiconductor chip 12 and mounting substrate 32. Electrode terminals 16 and 18 of semiconductor chip 12 are connected to chip connection terminals 36a and 36b, respectively, of mounting substrate 32. The one group of electrode terminals 28c of film capacitors 30 are connected to ground terminals 36c of mounting substrate 32. The other group of electrode terminals 24a are connected to electrode terminals 16, which are predetermined electrode terminals of electrode terminals 16 and 18 of semiconductor chip 12.

As shown in FIG. 1A, in capacitor-equipped semiconductor device 10 of the present exemplary embodiment, the other group of electrode terminals 24a and the one group of electrode terminals 28c of film capacitors 30 of sheet-like substrate 20 are exposedly disposed. In the same manner, chip connection terminals 36a, 36b and ground terminals 36c of mounting substrate 32 are exposedly disposed. After being disposed in this manner, wire leads 40, 42, and 44 provide the connection between electrode terminals 16, 18 of semiconductor chip 12 and chip connection terminals 36a, 36b of mounting substrate 32; between the one group of electrode terminals 28c of film capacitors 30 and ground terminals 36c of mounting substrate 32; and between the other group of electrode terminals 24a of film capacitors 30 and electrode terminals 16 of semiconductor chip 12.

In order to protect wire leads 40, 42, and 44 and semiconductor chip 12, there is provided encapsulating resin 46 as shown in FIG. 1B. External connection terminals 38 of mounting substrate 32 have protruding electrodes 39 thereon to facilitate the mounting of mounting substrate 32 onto a circuit board.

The capacitor-equipped semiconductor device of the present exemplary embodiment is described in detail as follows.

As shown in FIG. 2A, semiconductor chip 12 of the present exemplary embodiment includes silicon substrate 14 having a circuit (unillustrated) thereon formed by conventional semiconductor process. The circuit is connected to mounting substrate 32 via electrode terminals 16 and 18 arranged at both ends in the width direction of silicon substrate 14. Of electrode terminals 16 and 18, electrode terminals 16 are the predetermined electrode terminals from which noise needs to be reduced by providing the capacitors.

As shown in FIGS. 1A, 1B, and 2B, sheet-like substrate 20 is larger in size than semiconductor chip 12. The other group of electrode terminals 24a of film capacitors 30 are disposed in the positions on sheet-like substrate 20 that correspond to the predetermined electrode terminals 16 of semiconductor chip 12. On the other hand, the one group of electrode terminals 28c of film capacitors 30 are disposed on both ends in the longitudinal direction of sheet-like substrate 20. The detailed structure of sheet-like substrate 20 will be described later.

As shown in FIG. 2C, mounting substrate 32 is larger in size than sheet-like substrate 20. When sheet-like substrate 20 is fixedly bonded onto mounting substrate 32, chip connection terminals 36a, 36b and ground terminals 36c are exposedly disposed in the positions corresponding to the electrode terminals of sheet-like substrate 20 and semiconductor chip 12. Chip connection terminals 36a, 36b and ground terminals 36c are connected to external connection terminals 38 formed on the rear surface of mounting substrate 32 via unillustrated wiring patterns and via holes. External connection terminals 38 are provided thereon with protruding electrodes 39.

Mounting substrate 32 includes base material 34 which can be a resin base material such as a glass epoxy base material or an aramid resin base material, or a ceramic base material. The base material is provided with wiring layers on both surfaces thereof and also in its inside so as to form mounting substrate 32.

Mounting substrate 32, sheet-like substrate 20, and semiconductor chip 12 thus structured are positioned in this order and fixedly bonded to each other. After this, wire bonding is performed to connect between electrode terminals 16, 18 of semiconductor chip 12 and chip connection terminals 36a, 36b; between the one group of electrode terminals 28c of film capacitors 30 and ground terminals 36c; and the other group of electrode terminals 24a of film capacitors 30 and electrode terminals 16 of semiconductor chip 12.

In this case, electrode terminals 16 are first connected to the other group of electrode terminals 24a of film capacitors 30, and then the other group of electrode terminals 24a are connected to chip connection terminals 36a of mounting substrate 32. As a result, electrode terminals 16 and chip connection terminals 36a are directly electrically connected to each other. The other group of electrode terminals 24a of film capacitors 30 connected to electrode terminals 16 are extended from lower electrode films 24 of film capacitors 30. The one group of electrode terminals 28c are connected to upper electrode films 28 of film capacitors 30 via common connection portion 28a and extension portions 28b of upper electrode films 28. Film capacitors 30 are each formed of lower electrode film 24, dielectric film 26, and upper electrode film 28 stacked in this order.

The aforementioned predetermined electrode terminals 16 are directly connected to chip connection terminals 36a. Electrode terminals 16 are connected to film capacitors 30 via the other group of electrode terminals 24a, and also to ground terminals 36c via the one group of electrode terminals 28c.

Figure 3A:
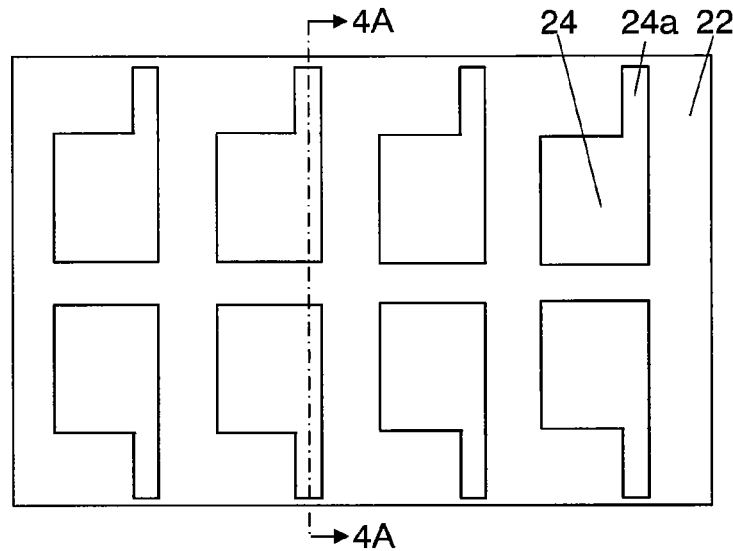
FIG. 3A is a plan view of a sheet base material having lower electrode films and the other group of electrode terminals formed thereon in a method for producing the sheet-like substrate of the capacitor-equipped semiconductor device according to the first exemplary embodiment of the present invention.
Figure 3B:
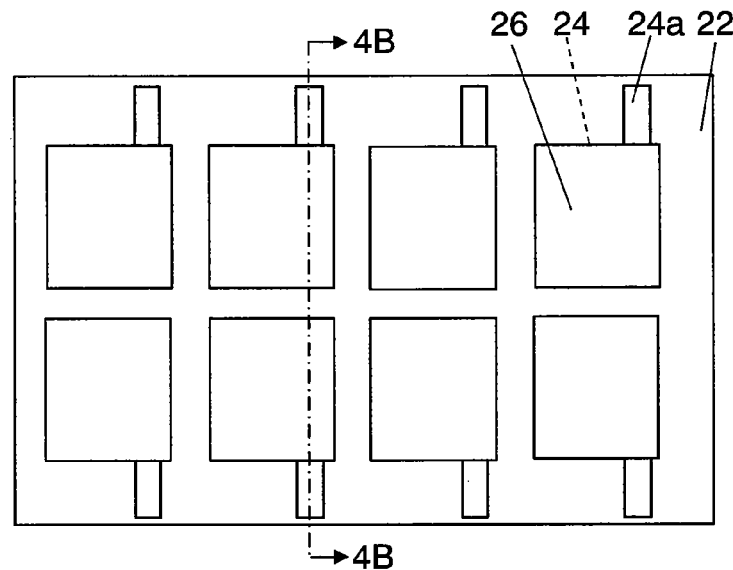
FIG. 3B is a plan view of the sheet base material having dielectric films formed further thereon in the method for producing the sheet-like substrate of the capacitor-equipped semiconductor device according to the first exemplary embodiment of the present invention.
Figure 3C:
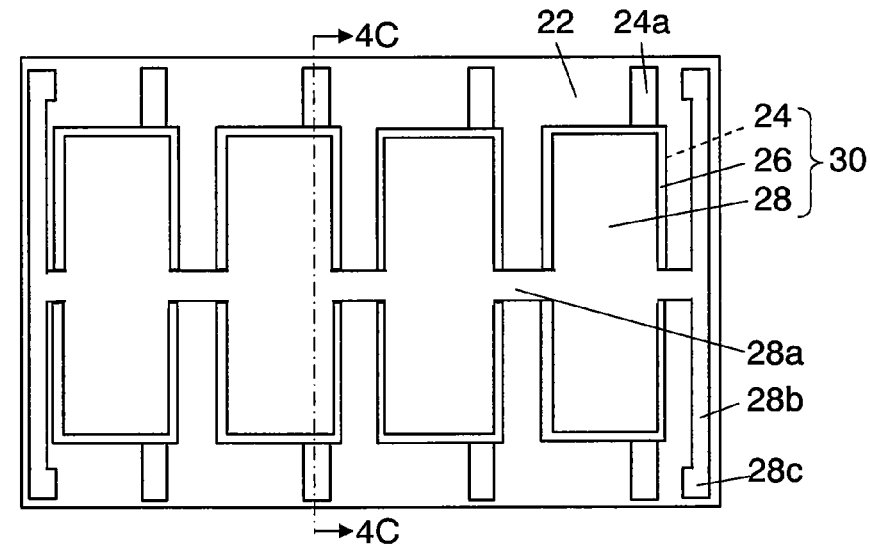
FIG. 3C is a plan view of the sheet base material having upper electrode films and one group of electrode terminals formed further thereon in the method for producing the sheet-like substrate of the capacitor-equipped semiconductor device according to the first exemplary embodiment of the present invention.

FIGS. 3A to 3C are plan views of primary processes showing the method for producing sheet-like substrate 20. FIG. 3A is a plan view of sheet base material 22 having lower electrode films 24 and the other group of electrode terminals 24a formed thereon. FIG. 3B is a plan view of sheet base material 22 having dielectric films 26 formed further thereon. FIG. 3C is a plan view of sheet base material 22 having upper electrode films 28 and the one group of electrode terminals 28c formed further thereon.

Figure 4A:
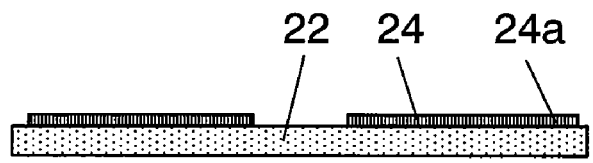
FIG. 4A is a sectional view taken along line 4A to 4A of FIG. 3A.
Figure 4B:
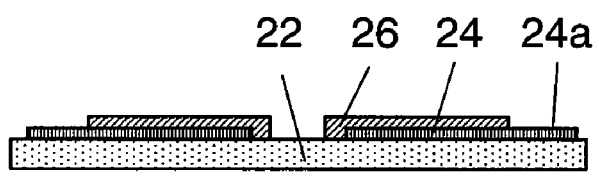
FIG. 4B is a sectional view taken along line 4B-4B of FIG. 3B.
Figure 4C:
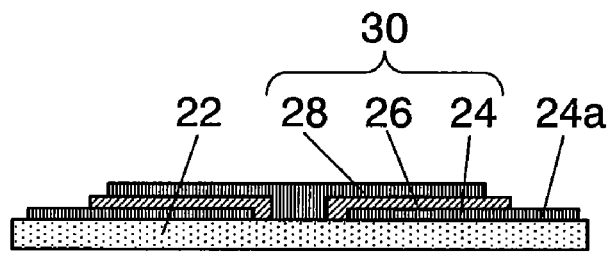
FIG. 4C is a sectional view taken along line 4C-4C of FIG. 3C.

FIG. 4A is a sectional view taken along line 4A to 4A of FIG. 3A. FIG. 4B is a sectional view taken along line 4B-4B of FIG. 3B. FIG. 4C is a sectional view taken along line 4C-4C of FIG. 3C.

As shown in FIGS. 3A and 4A, a metal thin film such as aluminum (Al) or copper (Cu) is formed on sheet base material 22 by sputtering. Then, photolithography and etching are applied to form predetermined patterns. Alternatively, the predetermined patterns can be formed by film forming technique using a mask at the same time as the thin film.

Sheet base material 22 can be made of any insulating material having flexibility and heat resistance and a smooth surface without particular constraints. For example, a polyimide film satisfying the requirements is one of the preferable materials. The polyimide film preferably has a thickness of 10 µm to 100 µm.

Next, as shown in FIGS. 3B and 4B, dielectric films 26 are formed so as to cover lower electrode films 24. Dielectric films 26 can be made of a material used for thin film capacitors, such as a PZT film (a lead zirconium titanium oxide film), a BST film (a barium strontium titanium oxide film), a STO film (a strontium titanium oxide film), a tantalum oxide film (a $Ta_2O_5$ film), or a silicon nitride film (a $Si_3N_4$ film). These films can be formed by sputtering, the sol-gel method, ion beam deposition, electron beam deposition, chemical vapor deposition (CVD) or plasma CVD, and processed by photolithography and etching so as to have predetermined patterns.

Next, as shown in FIGS. 3C and 4C, upper electrode films 28 are formed. Upper electrode films 28 connect all film capacitors 30 via common connection portion 28a. Furthermore, extension portions 28b extended from common connection portion 28a are connected to the one group of electrode terminals 28c. Upper electrode films 28, common connection portion 28a, extension portions 28b, and the one group of electrode terminals 28c are formed together of the same material and by the same method.

Upper electrode films 28 can be formed of the same material and by the same method as lower electrode films 24. In the case where upper electrode films 28 are formed by photolithography and etching, it is preferable that upper electrode films 28 are made of a material that does not cause lower electrode films 24 or dielectric films 26 to be damaged by a chemical solution or an etching gas during the etching of upper electrode films 28. Common connection portion 28a and extension portions 28b can be plated with a metal film such as copper (Cu) in order to reduce the resistance.

When finally connected via the wire leads as in the present exemplary embodiment, the other group of electrode terminals 24a and the one group of electrode terminals 28c are preferably coated with aluminum (Al) or gold (Au).

As described hereinbefore, capacitor-equipped semiconductor device 10 of the present exemplary embodiment is formed by interposing thin sheet-like substrate 20 having a necessary number of film capacitors 30 thereon between semiconductor chip 12 and mounting substrate 32. This structure can reduce the space occupancy of film capacitors 30 on the circuit board, thereby achieving a reduction in the size of the circuit board compared with the case of using a chip capacitor.

Furthermore, the aforementioned structure does not require semiconductor chip 12 to be specially processed. In addition, mounting substrate 32 and sheet-like substrate 20 having film capacitors 30 can be formed separately from each other, thereby providing a simple production process and a high production yield. As a result, capacitor-equipped semiconductor device 10 can be manufactured by using only the non-defective units of mounting substrate 32 and sheet-like substrate 20, thereby providing a high yield as a whole.

In the present exemplary embodiment, the one group of electrode terminals of the film capacitors are connected to the ground terminals of the mounting substrate, but the present invention is not limited to this structure. For example, when the semiconductor chip has ground terminals, the one group of electrode terminals of the film capacitors can be connected to the ground terminals of the semiconductor chip. This is because the ground terminals of the semiconductor chip are connected to the ground terminals in the corresponding positions on the mounting substrate.

In the present exemplary embodiment, the electrode terminals of the semiconductor chip are arranged in the longitudinal direction, but the present invention is not limited to this. For example, the electrode terminals can be arranged around the four sides of the semiconductor chip.

Figure 5:
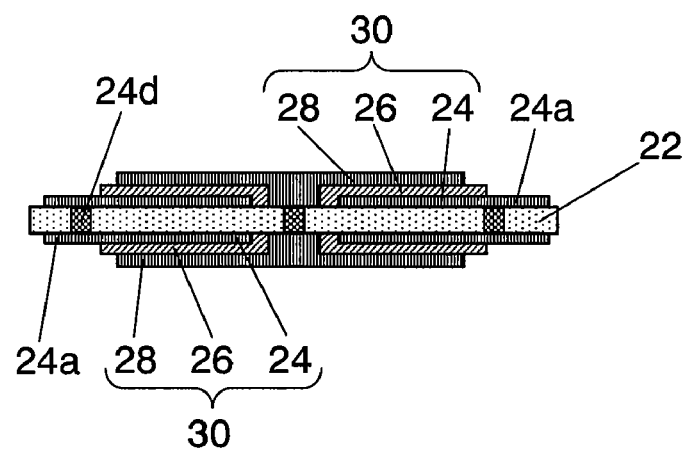
FIG. 5 is a sectional view of the sheet-like substrate having a film capacitor on both sides thereof of the capacitor-equipped semiconductor device according to the first exemplary embodiment of the present invention.

In the present exemplary embodiment, the film capacitors are formed on one side of the sheet-like substrate, but the present invention is not limited to this. For example, as shown in FIG. 5, sheet base material 22 can be provided with film capacitors 30 on both sides thereof, and the electrode terminals on one side can be connected to those on the other side by via holes 24d or the like. This structure can increase the number of film capacitors 30 to be formed and cope with the case where there are a larger number of predetermined electrode terminals or the case where a larger capacity is required.

Second Exemplary Embodiment

Figure 6:
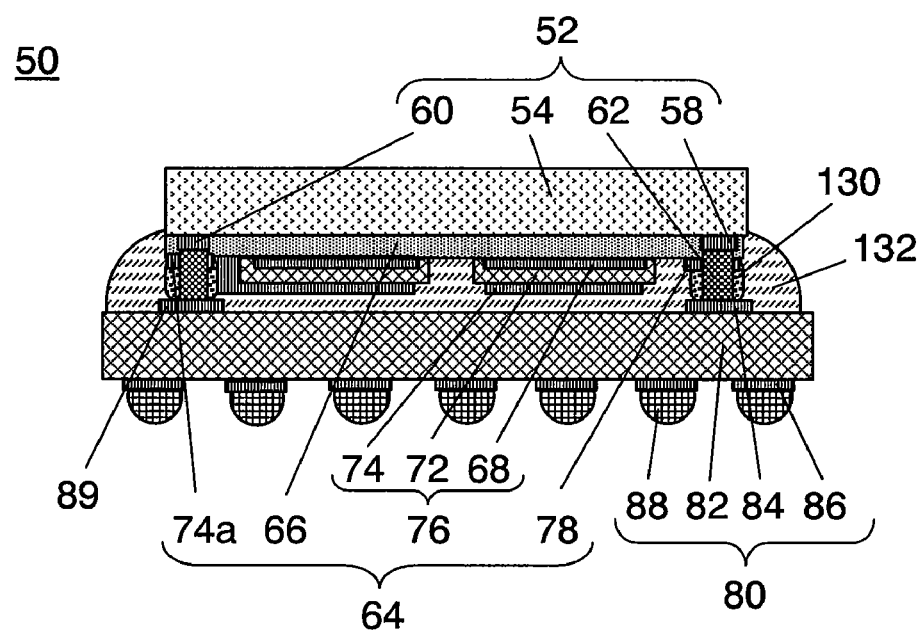
FIG. 6 is a sectional view of a capacitor-equipped semiconductor device according to a second exemplary embodiment of the present invention.

FIG. 6 is a sectional view of capacitor-equipped semiconductor device 50 according to a second exemplary embodiment of the present invention.

Figure 7A:
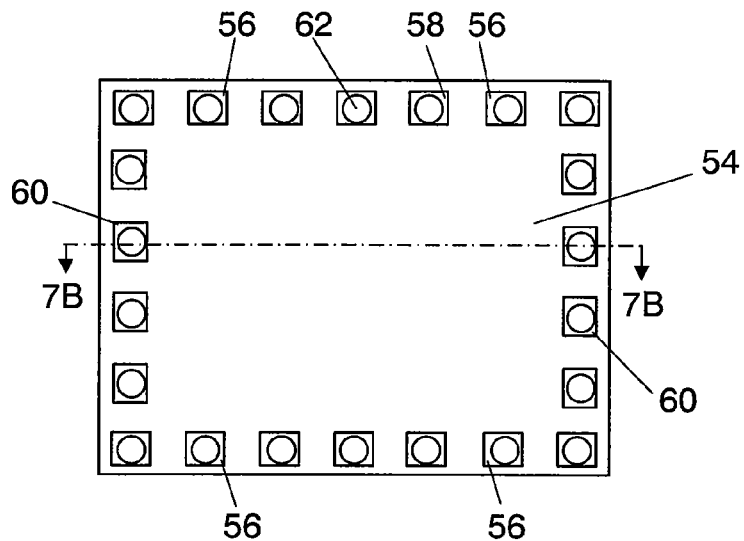
FIG. 7A is a plan view of a semiconductor chip of the capacitor-equipped semiconductor device according to the second exemplary embodiment of the present invention.
Figure 7B:
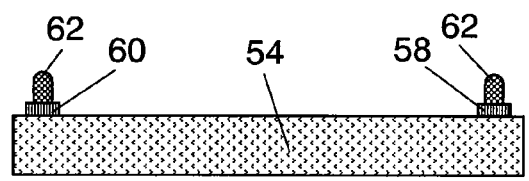
FIG. 7B is a sectional view taken along line 7B-7B of FIG. 7A.

FIG. 7A is a plan view of semiconductor chip 52 of capacitor-equipped semiconductor device 50 of the present exemplary embodiment. FIG. 7B is a sectional view taken along line 7B-7B of FIG. 7A.

Figure 8A:
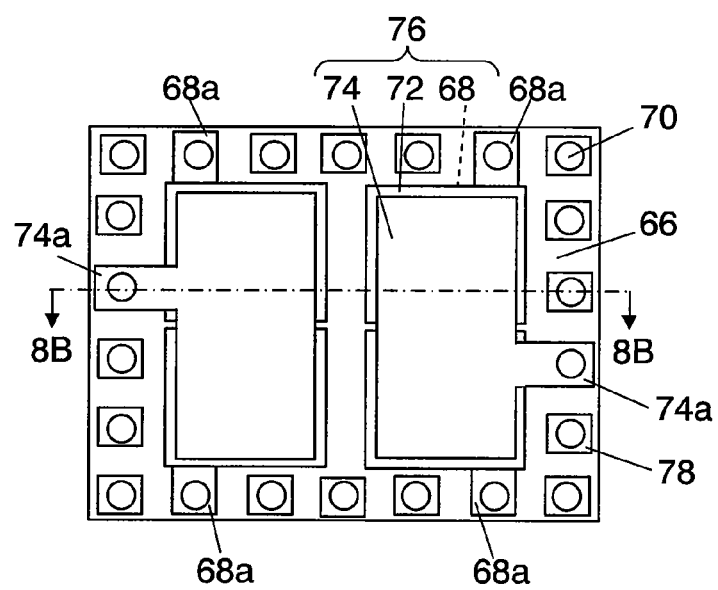
FIG. 8A is a plan view of a sheet-like substrate of the capacitor-equipped semiconductor device according to the second exemplary embodiment of the present invention.
Figure 8B:
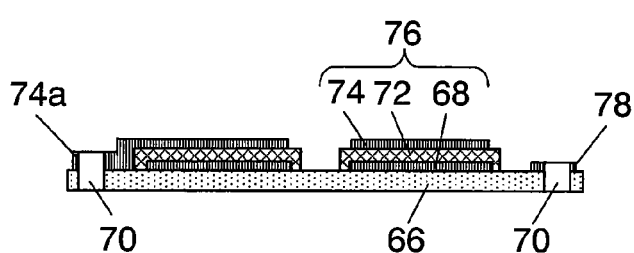
FIG. 8B is a sectional view taken along line 8B-8B of FIG. 8A.

FIG. 8A is a plan view of sheet-like substrate 64 of capacitor-equipped semiconductor device 50 according to the present exemplary embodiment. FIG. 8B is a sectional view taken along line 8B-8B of FIG. 8A.

Figure 9A:
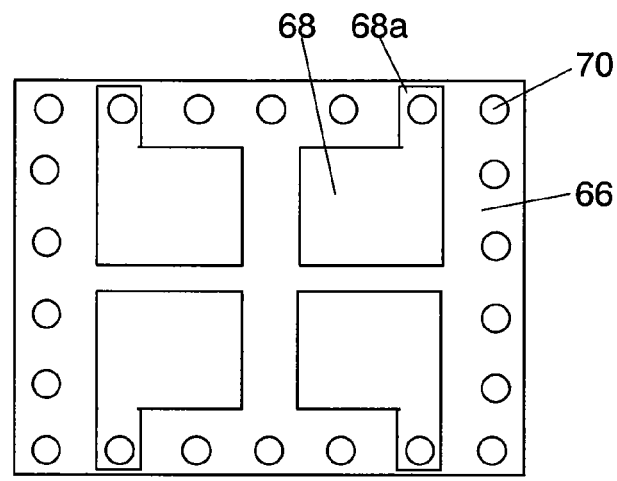
FIG. 9A is a plan view of a sheet base material having lower electrode films and the other group of electrode terminals formed thereon in a method for producing the sheet-like substrate of the capacitor-equipped semiconductor device according to the second exemplary embodiment of the present invention.
Figure 9B:
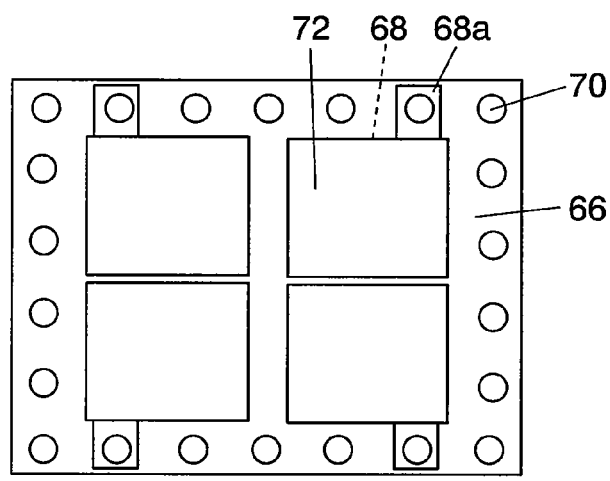
FIG. 9B is a plan view of the sheet base material having dielectric films formed further thereon in the method for producing the sheet-like substrate of the capacitor-equipped semiconductor device according to the second exemplary embodiment of the present invention.
Figure 9C:
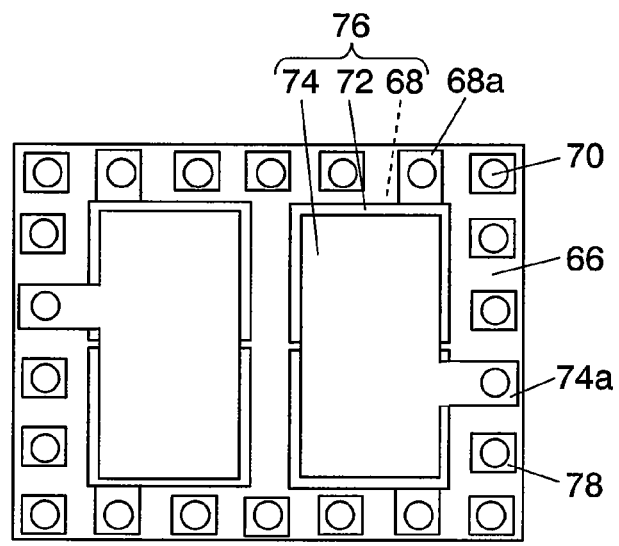
FIG. 9C is a plan view of the sheet base material having upper electrode films and one group of electrode terminals formed further thereon in the method for producing the sheet-like substrate of the capacitor-equipped semiconductor device according to the second exemplary embodiment of the present invention.

FIGS. 9A to 9C are plan views showing the method for producing sheet-like substrate 64 of capacitor-equipped semiconductor device 50 according to the present exemplary embodiment. FIG. 9A is a plan view of sheet base material 66 having lower electrode films 68 and the other group of electrode terminals 68a formed thereon. FIG. 9B is a plan view of sheet base material 66 having dielectric films 72 formed further thereon. FIG. 9C is a plan view of sheet base material 66 having upper electrode films 74 and one group of electrode terminals 74a formed further thereon.

Figure 10A:
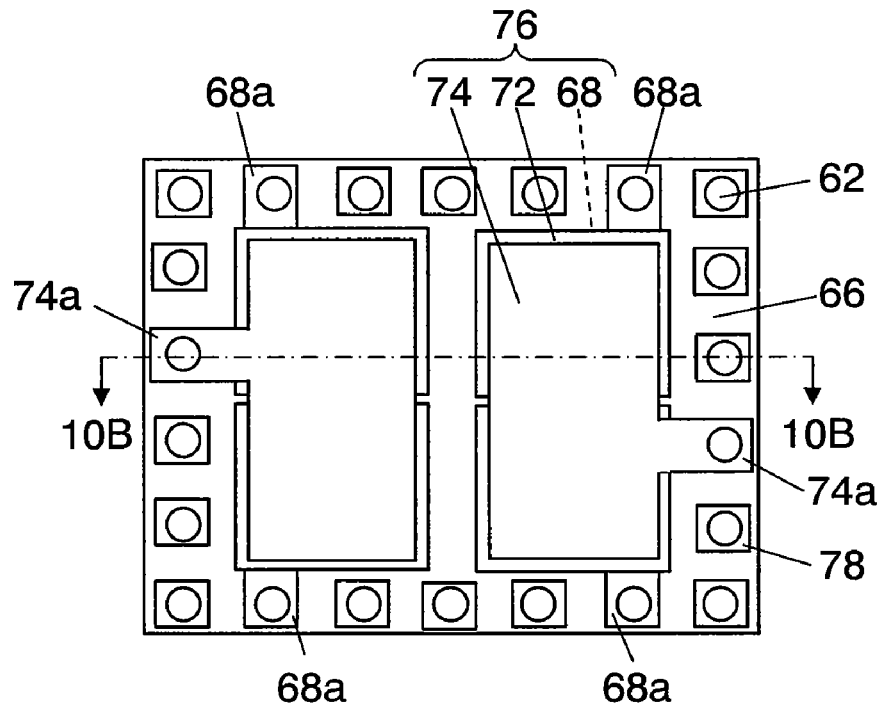
FIG. 10A is a plan view of the sheet-like substrate bonded onto the surface of the semiconductor chip that has electrode terminals thereon in the capacitor-equipped semiconductor device according to the second exemplary embodiment of the present invention.
Figure 10B:
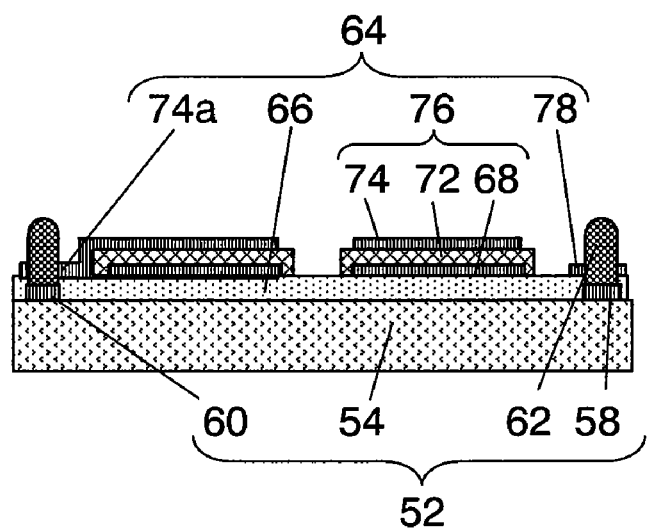
FIG. 10B is a sectional view taken along line 10B-10B of FIG. 10A.

FIG. 10A is a plan view of sheet-like substrate 64 bonded onto the surface of semiconductor chip 52 that has electrode terminals 56, 58, and 60 thereon. FIG. 10B is a sectional view taken along line 10B-10B of FIG. 10A.

Capacitor-equipped semiconductor device 50 of the present exemplary embodiment is described as follows with reference to FIGS. 6 to 10B.

As primarily shown in FIG. 6, capacitor-equipped semiconductor device 50 of the present exemplary embodiment includes semiconductor chip 52, sheet-like substrate 64, and mounting substrate 80. Semiconductor chip 52 has a plurality of electrode terminals 56, 58, and 60. Sheet-like substrate 64 has a plurality of film capacitors 76 formed by film forming technique. Mounting substrate 80 is mounted on an external substrate. Mounting substrate 80 is provided on one side thereof with chip connection terminals 84 and ground terminals 89. Chip connection terminals 84 are disposed to correspond to electrode terminals 56, 58, and 60 of semiconductor chip 52. Ground terminals 89 are disposed to correspond to the one group of electrode terminals 74a of film capacitors 76 of sheet-like substrate 64. Mounting substrate 80 is provided on the other side thereof with external connection terminals 86. External connection terminals 86 are connected to chip connection terminals 84 and ground terminals 89 and used to mount mounting substrate 80 on an external substrate. Mounting substrate 80 is also provided with protruding electrodes 88 on external connection terminals 86.

Sheet-like substrate 64 is interposed between semiconductor chip 52 and mounting substrate 80. Electrode terminals 56 and 58 of semiconductor chip 52 are connected to chip connection terminals 84. The one group of electrode terminals 74a of film capacitors 76 are connected to ground terminals 89. The other group of electrode terminals 68a are connected to electrode terminals 56, which are predetermined electrode terminals of electrode terminals 56 and 58 of semiconductor chip 52.

In semiconductor chip 52, electrode terminals 56, 58, and 60 have protruding electrodes 62 formed thereon. In sheet-like substrate 64, there are provided through-holes 70 in the positions corresponding to protruding electrodes 62, and the one group of electrode terminals 74a and the other group of electrode terminals 68a are extended to through-holes 70.

Sheet-like substrate 64 is bonded onto the surface of semiconductor chip 52 that has protruding electrodes 62 thereon. At the same time, protruding electrodes 62 of semiconductor chip 52 are inserted into through-holes 70 of sheet-like substrate 64. In this case, protruding electrodes 62 protrude beyond sheet-like substrate 64 so as to be connected to chip connection terminals 84 and ground terminals 89. In the present exemplary embodiment, sheet-like substrate 64 has the same outer dimensions as semiconductor chip 52.

Sheet-like substrate 64 bonded onto semiconductor chip 52 is positioned and fixed on mounting substrate 80 as shown in FIG. 6, and then protruding electrodes 62 are connected to chip connection terminals 84 of mounting substrate 80 via conductive connecting members 130. The space between semiconductor chip 52 and mounting substrate 80 including the connected portion is filled with underfill resin 132 and hardened. Mounting substrate 80 is mounted on the external circuit board via protruding electrodes 88 formed on the surfaces of external connection terminals 86 connected to chip connection terminals 84. Conductive connecting members 130 can be made of a conductive adhesive, solder, or the like.

Capacitor-equipped semiconductor device 50 of the present exemplary embodiment can be compact when sheet-like substrate 64 and semiconductor chip 52 are mounted on mounting substrate 80 because sheet-like substrate 64 has the same outer dimensions as semiconductor chip 52. Furthermore, capacitor-equipped semiconductor device 50 can be manufactured at low cost because semiconductor chip 52 is not required to be specially processed.

Film capacitors 76 of sheet-like substrate 64 can be protected by applying a protective film, but are protected by underfill resin 132 without the protective film.

As shown in FIGS. 7A and 7B, in semiconductor chip 52 of the present exemplary embodiment, silicon substrate 54 has a circuit (unillustrated) formed by the conventional semiconductor process. The circuit is connected to mounting substrate 80 via electrode terminals 56, 58, and 60 arranged around the periphery of silicon substrate 54. Of electrode terminals 56, 58, and 60, electrode terminals 56 are predetermined electrode terminals from which noise needs to be reduced by providing the capacitors. Electrode terminals 60 are ground terminals and connected to ground terminals 89 of mounting substrate 80.

As shown in FIGS. 8A and 8B, sheet-like substrate 64 has the same outer dimensions as semiconductor chip 52, and through-holes 70 are formed in the positions on sheet-like substrate 64 that correspond to protruding electrodes 62 of semiconductor chip 52.

The detailed structure and production method of sheet-like substrate 64 are described as follows with reference to FIGS. 9A to 9C.

First, as shown in FIG. 9A, a metal thin film such as aluminum (Al) or copper (Cu) is formed on sheet base material 66 by sputtering. Then, photolithography and etching are applied to form predetermined patterns. Alternatively, the predetermined patterns can be formed by film forming technique using a mask at the same time as the thin film.

Sheet base material 66 can be made of any insulating material having flexibility and heat resistance and a smooth surface without particular constraints. For example, a polyimide film satisfying the requirements is one of the preferable materials. The polyimide film preferably has a thickness of 10 μm to 100 μm.

Next, as shown in FIG. 9B, dielectric films 72 are formed so as to cover lower electrode films 68. Dielectric films 72 can be made of the same material and by the same method as in the first exemplary embodiment. More specifically, dielectric films 72 can be made of a material used for thin film capacitors such as a PZT film (a lead zirconium titanium oxide film), a BST film (a barium strontium titanium oxide film), a STO film (a strontium titanium oxide film), a tantalum oxide film (a $Ta_2O_5$ film), or a silicon nitride film (a $Si_3N_4$ film). These films can be formed by sputtering, the sol-gel method, ion beam deposition, electron beam deposition, chemical vapor deposition (CVD) or plasma CVD, and processed by photolithography and etching so as to have predetermined patterns.

Next, as shown in FIG. 9C, upper electrode films 74 are formed. In present exemplary embodiment, each of upper electrode films 74 connects two film capacitors 76 and is extended to the one group of electrode terminals 74a. Upper electrode films 74 and the one group of electrode terminals 74a are formed together of the same material and by the same method.

Upper electrode films 74 can be formed of the same material and by the same method as lower electrode films 68. In the case where upper electrode films 74 are formed by photolithography and etching, it is preferable that upper electrode films 74 are made of a material that does not cause lower electrode films 68 or dielectric films 72 to be damaged by a chemical solution or an etching gas during the etching of upper electrode films 74.

The aforementioned processes provide film capacitors 76 each formed of lower electrode film 68, dielectric film 72, and upper electrode film 74.

In the present exemplary embodiment, in addition to the other group of electrode terminals 68a and the one group of electrode terminals 74a to be connected to electrode terminals 56 and 60 of semiconductor chip 52, there are provided dummy terminals 78 in the regions around through-holes 70. Dummy terminals 78 contribute to an improvement in mechanical connection reliability because they are fixedly bonded to mounting substrate 80 by conductive connecting members 130 when chip connection terminals 84 of mounting substrate 80 are connected to protruding electrodes 62.

The one group of electrode terminals 74a and the other group of electrode terminals 68a are preferably made of the same material at least in their surface layers. The surface layers may be plated with a metal such as copper (Cu) in order to reduce the resistance from upper electrode films 74 to the one group of electrode terminals 74a.

As apparent from the plan view of FIG. 10A, semiconductor chip 52 having the same outer dimensions as sheet-like substrate 64 appears only in protruding electrodes 62 inserted into through-holes 70.

Sheet-like substrate 64 includes a plurality of film capacitors 76 each formed of lower electrode film 68, dielectric film 72, and upper electrode film 74 stacked in this order and processed into a predetermined shape. In film capacitors 76, the predetermined electrode terminals 56 of semiconductor chip 52 are connected to the other group of electrode terminals 68a extended from lower electrode films 68; and the one group of electrode terminals 74a extended from upper electrode films 74 are connected to electrode terminals 60, which are the ground terminals of semiconductor chip 52.

Protruding electrodes 62 of semiconductor chip 52 are inserted into through-holes 70 of sheet-like substrate 64 and protrude beyond sheet-like substrate 64.

Sheet-like substrate 64 is bonded onto semiconductor chip 52 and fixedly positioned on mounting substrate 80 as described above with protruding electrodes 62 exposed from through-holes 70. As a result, protruding electrodes 62 and chip connection terminals 84 of mounting substrate 80 are connected to each other via conductive connecting members 130.

In this case, the one group of electrode terminals 74a and the other group of electrode terminals 68a are connected to ground terminals 89, predetermined electrode terminals 56, and electrode terminals 60 which are ground terminals via conductive connecting members 130 at the same time when protruding electrodes 62 and chip connection terminals 84 are connected to each other via conductive connecting members 130. Conductive connecting members 130 can be made of a conductive adhesive, solder, or the like.

When the space between semiconductor chip 52 and mounting substrate 80 including the connected portion is filled with underfill resin 132 and hardened, capacitor-equipped semiconductor device 50 of the present exemplary embodiment shown in FIG. 6 is complete.

In the present exemplary embodiment, the film capacitors are formed on one side of the sheet-like substrate, but the present invention is not limited to this. For example, as in the first exemplary embodiment, the sheet base material can be provided with the film capacitors on both sides thereof, and the electrode terminals on one side can be connected to those on the other side by via holes or the like. This structure can increase the number of the film capacitors to be formed and cope with the case where there are a larger number of predetermined electrode terminals or the case where a larger capacity is required.

Third Exemplary Embodiment

Figure 11:
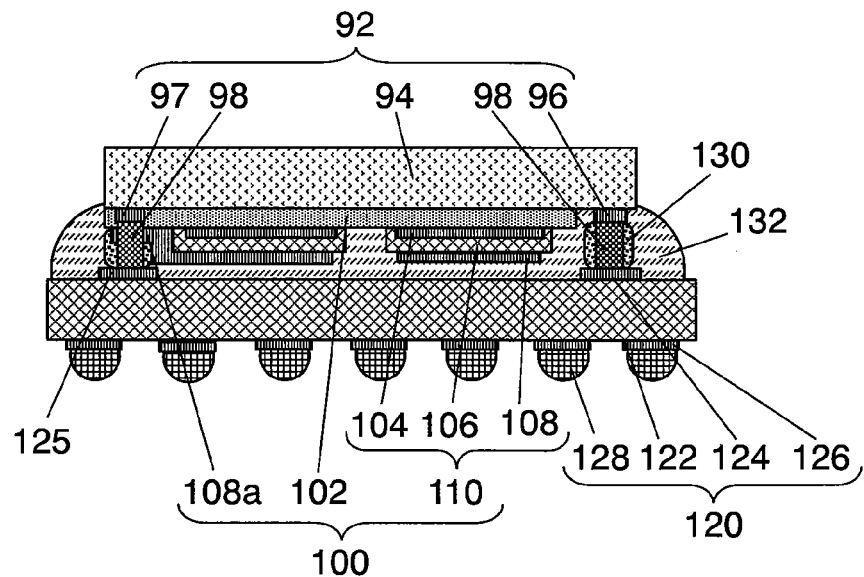
FIG. 11 is a sectional view of a capacitor-equipped semiconductor device according to a third exemplary embodiment of the present invention.

FIG. 11 is a sectional view of capacitor-equipped semiconductor device 90 according to a third exemplary embodiment of the present invention.

Figure 12:
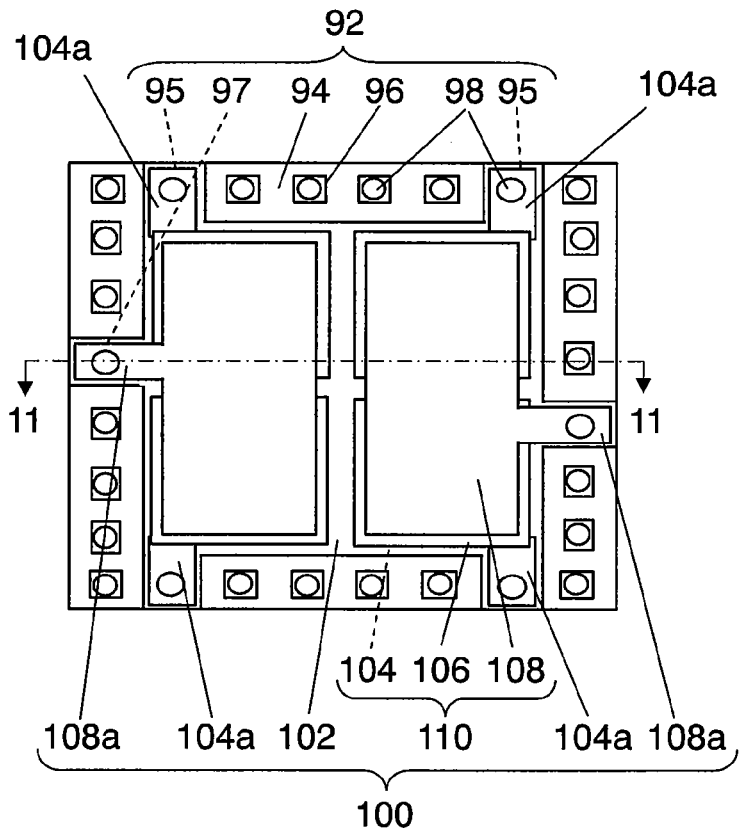
FIG. 12 is a plan view of the sheet-like substrate bonded onto the surface of the semiconductor chip that has a circuit thereon in the capacitor-equipped semiconductor device according to the third exemplary embodiment of the present invention.

FIG. 12 is a plan view of sheet-like substrate 100 bonded onto the surface of semiconductor chip 92 that has a circuit thereon.

Figure 13A:
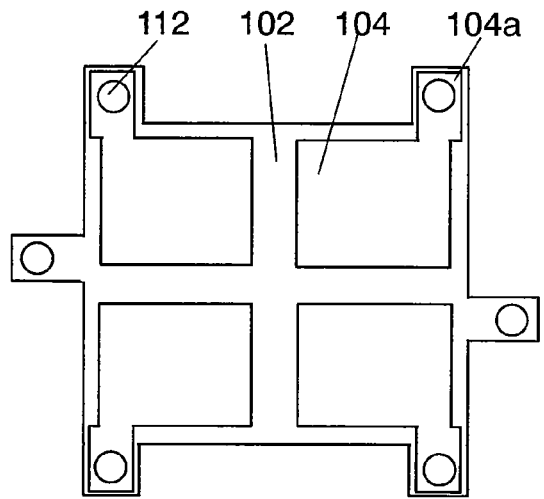
FIG. 13A is a plan view of a sheet base material having lower electrode films and the other group of electrode terminals formed thereon in a method for producing the sheet-like substrate of the capacitor-equipped semiconductor device according to the third exemplary embodiment of the present invention.
Figure 13B:
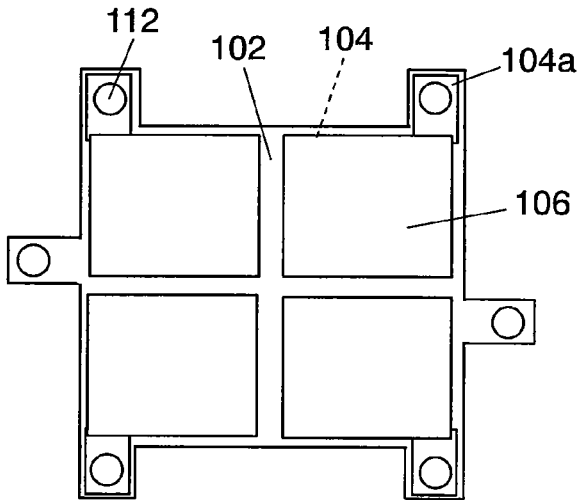
FIG. 13B is a plan view of the sheet base material having dielectric films formed further thereon in the method for producing the sheet-like substrate of the capacitor-equipped semiconductor device according to the third exemplary embodiment of the present invention.
Figure 13C:
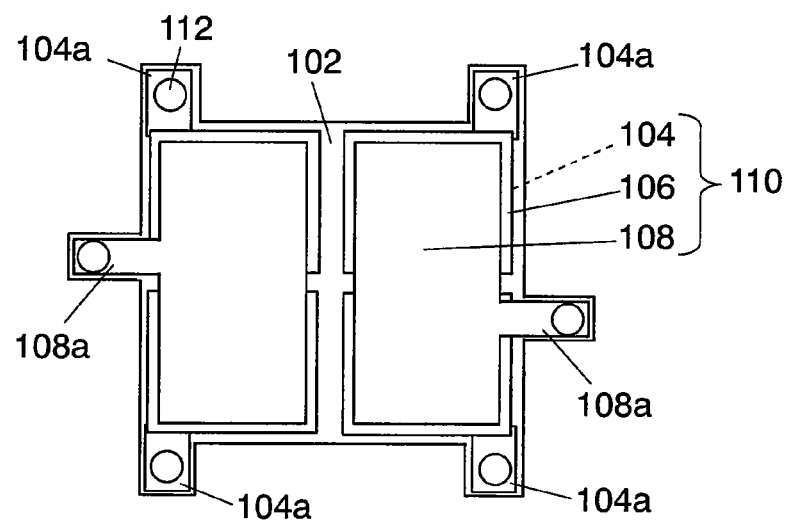
FIG. 13C is a plan view of the sheet base material having upper electrode films and one group of electrode terminals formed further thereon in the method for producing the sheet-like substrate of the capacitor-equipped semiconductor device according to the third exemplary embodiment of the present invention.

FIGS. 13A to 13C are plan views showing the method for producing sheet-like substrate 100 of capacitor-equipped semiconductor device 90 according to the present exemplary embodiment. FIG. 13A is a plan view of sheet base material 102 having lower electrode films 104 and the other group of electrode terminals 104a formed thereon. FIG. 13B is a plan view of sheet base material 102 having dielectric films 106 formed further thereon. FIG. 13C is a plan view of sheet base material 102 having upper electrode films 108 and one group of electrode terminals 108a formed further thereon. The sectional view of FIG. 11 is taken along line 11-11 of FIG. 12.

Capacitor-equipped semiconductor device 90 of the present exemplary embodiment is described as follows with reference to FIGS. 11 to 13C.

As primarily shown in FIG. 11, capacitor-equipped semiconductor device 90 of the present exemplary embodiment includes semiconductor chip 92, sheet-like substrate 100, and mounting substrate 120. Semiconductor chip 92 has a plurality of electrode terminals 95, 96, and 97. Sheet-like substrate 100 has a plurality of film capacitors 110 formed by film forming technique. Mounting substrate 120 is mounted on an external substrate. Mounting substrate 120 is provided on one side thereof with chip connection terminals 124 and ground terminals 125. Chip connection terminals 124 are disposed to correspond to electrode terminals 95, 96, and 97 of semiconductor chip 92. Ground terminals 125 are disposed to correspond to the one group of electrode terminals 108a of film capacitors 110 of sheet-like substrate 100. Mounting substrate 120 is provided on the other side thereof with external connection terminals 126. External connection terminals 126 are connected to chip connection terminals 124 and ground terminal and used to mount mounting substrate 120 on the external substrate. Mounting substrate 120 is also provided with protruding electrodes 128 on external connection terminals 126.

On semiconductor chip 92, electrode terminals 95 are connected to both the other group of electrode terminals 104a of film capacitors 110 and chip connection terminals 124; electrode terminals 97 are connected to both the one group of electrode terminals 108a and the ground terminals of mounting substrate 120; and electrode terminals 96 directly connected to chip connection terminals 124. Electrode terminals 95 are predetermined electrode terminals, and electrode terminals 97 are ground terminals.

As apparent from the plan view of FIG. 12, in sheet-like substrate 100, the region connected to electrode terminals 96, that is, the region other than the region connected to electrode terminals 95 and 97 of semiconductor chip 92 is cut off so as to expose electrode terminals 96 and protruding electrodes 98. In other words, sheet-like substrate 100 has smaller outer dimensions than semiconductor chip 92, but is extended to the edge of semiconductor chip 92 at least at the portions having through-holes into which to insert protruding electrodes 98 of electrode terminals 95 and 97.

The detailed structure and production method of sheet-like substrate 100 are described as follows with reference to FIGS. 13A to 13C.

First, as shown in FIG. 13A, a metal thin film such as aluminum (Al) or copper (Cu) is formed on sheet base material 102 by sputtering. Then, photolithography and etching are applied to form lower electrode films 104 and the other group of electrode terminals 104a in predetermined patterns. Alternatively, the predetermined patterns can be formed by film forming technique using a mask at the same time as the thin film.

Sheet base material 102 can be made of any insulating material having flexibility and heat resistance and a smooth surface without particular constraints. For example, a polyimide film satisfying the requirements is one of the preferable materials. The polyimide film preferably has a thickness of 10 µm to 100 µm.

Next, as shown in FIG. 13B, dielectric films 106 are formed so as to cover lower electrode films 104. Dielectric films 106 can be made of the same material and by the same method as in the first and second exemplary embodiments. More specifically, dielectric films 106 can be made of a material used for thin film capacitors such as a PZT film (a lead zirconium titanium oxide film), a BST film (a barium strontium titanium oxide film), a STO film (a strontium titanium oxide film), a tantalum oxide film) (a $Ta_2O_5$ film), or a silicon nitride film (a $Si_3N_4$ film). These films can be formed by sputtering, the sol-gel method, ion beam deposition, electron beam deposition, chemical vapor deposition (CVD) or plasma CVD, and processed by photolithography and etching so as to have predetermined patterns.

Next, as shown in FIG. 13C, upper electrode films 108 are formed. In present exemplary embodiment, each of upper electrode films 108 connects two film capacitors 110 and is extended to the one group of electrode terminals 108a. Upper electrode films 108 and the one group of electrode terminals 108a are formed together of the same material and by the same method.

Upper electrode films 108 can be formed of the same material and by the same method as lower electrode films 104. In the case where upper electrode films 108 are formed by photolithography and etching, it is preferable that upper electrode films 108 are made of a material that does not cause lower electrode films 104 or dielectric films 106 to be damaged by a chemical solution or an etching gas during the etching of upper electrode films 108.

The aforementioned processes provide film capacitors 110 each formed of lower electrode film 104, dielectric film 106, and upper electrode film 108.

The present exemplary embodiment is characterized by cutting off the region connected to electrode terminals 96, that is, the region other than the region of the other group of electrode terminals 104a and the one group of electrode terminals 108a of sheet-like substrate 100. As a result, only the other group of electrode terminals 104a and the one group of electrode terminals 108a have through-holes 112 formed therein.

The one group of electrode terminals 108a and the other group of electrode terminals 104a are preferably made of the same material at least in their surface layers. The surface layers may be plated with a metal such as copper (Cu) in order to reduce the resistance from upper electrode films 108 to the one group of electrode terminals 108a.

Sheet-like substrate 100 bonded onto semiconductor chip 92 as shown in FIG. 12 is positioned and fixed on mounting substrate 120 as shown in FIG. 11, and then protruding electrodes 98 are connected to chip connection terminals 124 of mounting substrate 120 via conductive connecting members 130 such as a conductive adhesive. The space between semiconductor chip 92 and mounting substrate 120 including the connected portion is filled with underfill resin 132 and hardened. Mounting substrate 120 is mounted on the external circuit board via protruding electrodes 128 formed on the surfaces of external connection terminals 126 connected to chip connection terminals 124.

The capacitor-equipped semiconductor device of the present exemplary embodiment can be compact when sheet-like substrate 100 and semiconductor chip 92 are mounted on mounting substrate 120 because sheet-like substrate 100 has smaller outer dimensions as semiconductor chip 92. Furthermore, the capacitor-equipped semiconductor device can be manufactured at low cost because semiconductor chip 92 is not required to be specially processed.

Film capacitors 110 of sheet-like substrate 100 can be protected by applying a protective film, but are protected by underfill resin 132 without the protective film.

In the capacitor-equipped semiconductor device of the present exemplary embodiment, the through-holes of the sheet-like substrate are formed only in the one group of electrode terminals and the other group of electrode terminals of the film capacitors. This facilitates the insertion of the protruding electrode into the through-holes when the sheet-like substrate is bonded onto the semiconductor chip, thereby simplifying the process.

Fourth Exemplary Embodiment

Figure 14A:
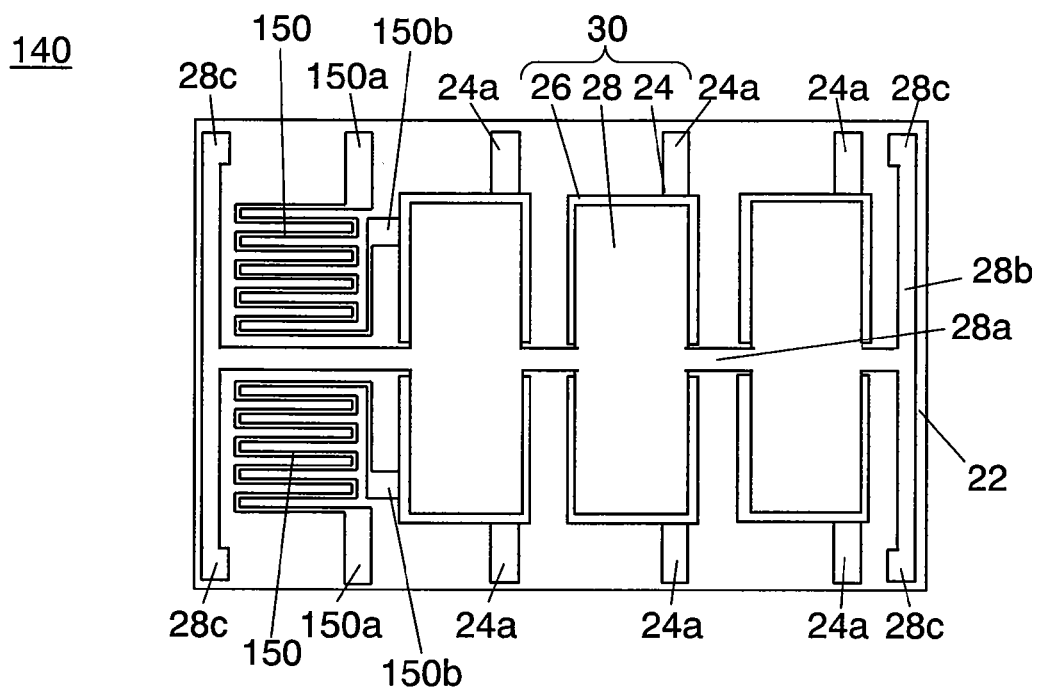
FIG. 14A is a plan view of a sheet-like substrate, which is a component of a capacitor-equipped semiconductor device according to a fourth exemplary embodiment of the present invention.

FIG. 14A is a plan view of a sheet-like substrate, which is a component of a capacitor-equipped semiconductor device according to a fourth exemplary embodiment of the present invention. The capacitor-equipped semiconductor device of the fourth exemplary embodiment is identical to that of the first exemplary embodiment except for the structure of the sheet-like substrate. Therefore, the same elements are referred to with the same reference numerals while referring to FIG. 1A, and the description except for the sheet-like substrate is omitted.

As shown in FIG. 14A, sheet-like substrate 140 of the present exemplary embodiment includes film capacitors 30 and film inductors 150 formed by film forming technique. Film inductors 150 each include first electrode terminal 150a and second electrode terminal 150b. First electrode terminals 150a of film inductors (L) 150 are connected to electrode terminals 16, which are predetermined electrode terminals of electrode terminals 16 and 18 of semiconductor chip 12 shown in FIG. 1A. Second electrode terminals 150b are connected to either the other group of electrode terminals 24a or lower electrodes (unillustrated) of film capacitors (C) 30. The other group of electrode terminals 24a of film capacitors 30 are connected to chip connection terminals 36a of mounting substrate 32. The predetermined electrode terminals 16 include the power supply terminals of semiconductor chip 12, the power supply terminals from which external noise needs to be reduced, and the power supply terminals that require to limit the frequency range of the signal to be transmitted therefrom.

As a result, the noise reduction function due to film capacitors 30 is provided in the output stage of the predetermined electrode terminals 16 of semiconductor chip 12 so as to form a so-called LC filter on sheet-like substrate 140. This provides a noise filtering function.

Film inductors 150 can be formed of a single film or a laminated film of copper (Cu), titanium (Ti), palladium (Pd), nickel (Ni), platinum (Pt) and gold (Au) by sputtering, ion beam deposition, electron beam deposition, chemical vapor deposition (CVD), plasma CVD, or the like, and then by applying photolithography and etching so as to form conductive patterns having a predetermined inductance.

Although the conductive patterns are shown in a meander shape, they can be in a coil shape instead.

In the present exemplary embodiment, the film inductors and the film capacitors are connected in series, but alternatively can be connected in parallel, which can provide an LC filter having necessary properties.

In the present exemplary embodiment, the first electrode terminals of the film inductors are connected to the electrode terminals of the semiconductor chip, but the present invention is not limited to this example. Alternatively, it is possible to connect the other group of electrode terminals of the film capacitors connected to the second electrode terminals of the film inductors to the electrode terminals of the semiconductor chip; and to connect the first electrode terminals of the film inductors to the chip connection terminals of the mounting substrate. Besides using the LC filter structure, it is possible to use the film inductors alone in the same manner as using the film capacitors alone. This provides a noise reduction function applicable to various properties.

Figure 14B:
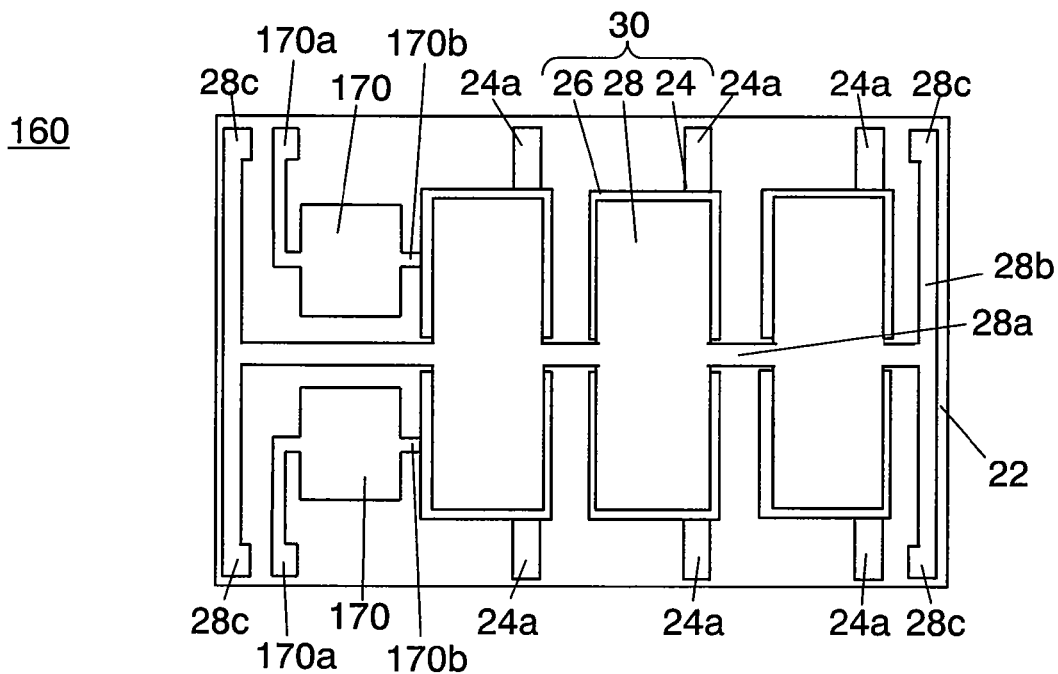
FIG. 14B is a plan view of another sheet-like substrate, which is a component of the capacitor-equipped semiconductor device according to the fourth exemplary embodiment of the present invention.

The following is a description of another sheet-like substrate used in the capacitor-equipped semiconductor device according to the fourth exemplary embodiment of the present invention with reference to FIG. 14B.

FIG. 14B is a plan view of the sheet-like substrate, which is a component of the capacitor-equipped semiconductor device according to the fourth exemplary embodiment of the present invention. Sheet-like substrate 160 has film resistors 170 instead of film inductors 150 of sheet-like substrate 140 shown in FIG. 14A.

As shown in FIG. 14B, sheet-like substrate 160 includes film capacitors 30 and film resistors 170 formed by film forming technique. Film resistors 170 each include first electrode terminal 170a and second electrode terminal 170b. First electrode terminals 170a of film resistors (R) 170 are connected to the predetermined electrode terminals 16 of electrode terminals 16 and 18 of semiconductor chip 12 shown in FIG. 1A, and second electrode terminals 170b are connected to either the other group of electrode terminals 24a or lower electrodes (unillustrated) of film capacitors (C) 30. The other group of electrode terminals 24a of film capacitors 30 are connected to chip connection terminals 36a of mounting substrate 32. The predetermined electrode terminals 16 include the power supply terminals of semiconductor chip 12, the power supply terminals from which external noise needs to be reduced, and the power supply terminals that require to limit the frequency range of the signal to be transmitted therefrom.

As a result, the noise reduction function due to film capacitors 30 is provided in the output stage of the predetermined electrode terminals 16 of semiconductor chip 12 so as to form a so-called RC filter on sheet-like substrate 160. This provides a noise filtering function.

Film resistors 170 can be made of tantalum nitride (TaN), nichrome-based alloy, platinum (Pt) or the like by sputtering, ion beam deposition, electron beam deposition, chemical vapor deposition (CVD), or plasma CVD, and then by applying photolithography and etching so as to form resistive patterns having a predetermined resistance value.

In the present exemplary embodiment, the film resistors and the film capacitors are connected in series, but alternatively can be connected in parallel, which can provide an RC filter having necessary properties.

In the present exemplary embodiment, the first electrode terminals of the film resistors are connected to the electrode terminals of the semiconductor chip, but the present invention is not limited to this example. Alternatively, it is possible to connect the other group of electrode terminals of the film capacitors connected to the second electrode terminals of the film resistors to the electrode terminals of the semiconductor chip; and to connect the first electrode terminals of the film resistors to the chip connection terminals of the mounting substrate.

The present exemplary embodiment shows the structures of an LC filter and an RC filter with reference to FIGS. 14A and 14B; however, the present invention is not limited to them. For example, it is possible to provide the sheet-like substrate with a film capacitor, a film inductor, and a film resistor so as to form an LCR filter. This results in a capacitor-equipped semiconductor device with high noise reduction and high selectivity in the frequency range.

In the first to fourth exemplary embodiments, the lower electrode films of the film capacitors are connected to the other group of electrode terminals; and the upper electrode films are connected to the electrode terminals, but the present invention is not limited to this structure. Alternatively, the lower electrode films can be connected to the one group of electrode terminals and the upper electrode films can be connected to the other group of electrode terminals. Although the dielectric film is divided to correspond to the four film capacitors, it can alternatively be formed in a single pattern so as to cover these film capacitors. Furthermore, the upper electrode films may be patterned to be connected to all the film capacitors.

In the first to fourth exemplary embodiments, the film capacitors are formed by thin film technology, but the present invention is not limited to this. Alternatively, it is possible that all of the lower electrode films, the dielectric films, the conductive patterns, the resistive patterns, and the upper electrode films are formed by print process technology such as print method, ink-jet method, or writing method. It is also possible to combine the thin film technology and the printing process technology.

In the second and third exemplary embodiments, the electrode terminals of the semiconductor chip are arranged around the four sides thereof, but the structure shown in the first exemplary embodiment can be alternatively used.

In the second and third exemplary embodiments, the sheet-like substrate has the same outer dimensions as the semiconductor chip, but the present invention is not limited to this. The sheet-like substrate can be larger than the semiconductor chip and smaller than the mounting substrate. Therefore, in the third exemplary embodiment, the region of the electrode terminals directly connected to the chip connection terminals may be formed as an opening instead of the notch. When the sheet-like substrate has larger outer dimensions than the semiconductor chip, the one group of electrode terminals can be directly connected to the ground terminals of the mounting substrate instead of using the electrode terminals of the semiconductor chip as the ground terminals. It can also be easily achieved to increase the capacity by increasing the number or area of the capacitors.

INDUSTRIAL APPLICABILITY

In the capacitor-equipped semiconductor device of the present invention, the sheet-like substrate at least having film capacitors is interposed between the semiconductor chip and the mounting substrate on which to mount the semiconductor chip; and in the semiconductor chip, the electrode terminals from which noise needs to be reduced are connected to the film capacitors. The capacitor-equipped semiconductor device, which can prevent noise in spite of being slim and compact, is useful to various semiconductor devices

The invention claimed is:

1. A capacitor-equipped semiconductor device comprising:
    a semiconductor chip having a plurality of electrode terminals;
    a sheet-like substrate including a polyimide layer and having a plurality of film capacitors with a plurality of electrode terminals corresponding to the plurality of electrode terminals of the semiconductor chip, the plurality of film capacitors being disposed on the polyimide layer; and
    a mounting substrate provided on one side thereof with chip connection terminals disposed to correspond to the electrode terminals of the semiconductor chip and a ground terminal disposed to correspond to one electrode terminal of the plurality of film capacitors of the sheet-like substrate, the mounting substrate being provided on an other surface thereof with an external connection terminal connected to the chip connection terminals and the ground terminal and used to mount the mounting substrate on an external substrate, wherein:
    the sheet-like substrate is interposed between the semiconductor chip and the mounting substrate,
    the electrode terminals of the semiconductor chip are connected to the chip connection terminals, and
    the one electrode terminal of the plurality of film capacitors is connected to the ground terminal, and another electrode terminal of the plurality of film capacitors is connected to a predetermined electrode terminal of the electrode terminals of the semiconductor chip.

2. The capacitor-equipped semiconductor device of claim 1, wherein:
    when the sheet-like substrate is disposed on the mounting substrate, and the semiconductor chip is disposed on the sheet-like substrate, the one electrode terminal and the other electrode terminal of the plurality of film capacitors are exposed on the sheet-like substrate,
    and the chip connection terminals and the ground terminal are exposed on the mounting substrate, and
    the electrode terminals of the semiconductor chip are connected to the chip connection terminals via wire leads; the one electrode terminal of the plurality of film capacitors is connected to the ground terminal via a wire lead, and the other electrode terminal of the plurality of film capacitors is connected to the electrode terminal of the semiconductor chip via a wire lead.

3. The capacitor-equipped semiconductor device of claim 1, wherein:
    the sheet-like substrate further includes one of a film inductor and a film resistor to be connected to the plurality of film capacitors,
    one of the film inductor and the film resistor has a first electrode terminal and a second electrode terminal, the first electrode terminal being connected to the predetermined electrode terminal of the electrode terminals of the semiconductor chip and the second electrode terminal being connected to the other electrode terminal of the plurality of film capacitor capacitors.

4. A capacitor-equipped semiconductor device comprising:
    a semiconductor chip having a plurality of electrode terminals;
    a sheet-like substrate having at least a film capacitor; and
    a mounting substrate provided on one side thereof with chip connection terminals disposed to correspond to the electrode terminals of the semiconductor chip and a ground terminal disposed to correspond to one electrode terminal of the film capacitor of the sheet-like substrate, the mounting substrate being provided on an other surface thereof with an external connection terminal connected to the chip connection terminals and the ground terminal and used to mount the mounting substrate on an external substrate, wherein:

the sheet-like substrate is interposed between the semiconductor chip and the mounting substrate, the electrode terminals of the semiconductor chip are connected to the chip connection terminals, the one electrode terminal of the film capacitor is connected to the ground terminal, and an other electrode terminal is connected to a predetermined electrode terminal of the electrode terminals of the semiconductor chip, the semiconductor chip further includes protruding electrodes on surfaces of the electrode terminals, the sheet-like substrate includes through-holes in positions corresponding to the protruding electrodes, and the one electrode terminal and the other electrode terminal are extended to the through-holes, the sheet-like substrate is bonded onto a surface of the semiconductor chip, the surface having the protruding electrodes thereon, the protruding electrodes of the semiconductor chip are inserted into the through-holes of the sheet-like substrate, and the protruding electrodes protruding beyond the sheet-like substrate are connected to the chip connection terminals.

5. The capacitor-equipped semiconductor device of claim 4, wherein
the sheet-like substrate has same outer dimensions as the semiconductor chip.

6. The capacitor-equipped semiconductor device of claim 4, wherein
the one electrode terminal and the other electrode terminal are connected to the ground terminal and the predetermined electrode terminal via a conductive connecting member at a same time when the protruding electrodes and the chip connection terminals are connected to each other via the conductive connecting member.

7. A capacitor-equipped semiconductor device comprising:
a semiconductor chip having a plurality of electrode terminals,
a sheet-like substrate having at least a film capacitor; and
a mounting substrate provided on one side thereof with chip connection terminals disposed to correspond to the electrode terminals of the semiconductor chip and a ground terminal disposed to correspond to one electrode terminal of the film capacitor of the sheet-like substrate, the mounting substrate being provided on an other surface thereof with an external connection terminal connected to the chip connection terminals and the ground terminal and used to mount the mounting substrate on an external substrate, wherein:

the sheet-like substrate is interposed between the semiconductor chip and the mounting substrate, the electrode terminals of the semiconductor chip are connected to the chip connection terminals, the one electrode terminal of the film capacitor is connected to the ground terminal, and an other electrode terminal is connected to a predetermined electrode terminal of the electrode terminals of the semiconductor chip, the semiconductor chip further includes protruding electrodes on surfaces of the electrode terminals, the one electrode terminal and the other electrode terminal of the sheet-like substrate are extended to a region where the predetermined electrode terminal of the semiconductor chip is formed, the region having through-holes into which the protruding electrodes are inserted, the sheet-like substrate is bonded onto a surface of the semiconductor chip, the surface having the protruding electrodes thereon, and a predetermined one of the protruding electrodes of the semiconductor chip is inserted into the through-hole of the sheet-like substrate, and the protruding electrodes protruding beyond the sheet-like substrate are connected to the chip connection terminals.

8. The capacitor-equipped semiconductor device of claim 7, wherein
the sheet-like substrate has smaller outer dimensions than the semiconductor chip; and
the sheet-like substrate is extended at least in the region having the through-holes therein to an edge of the semiconductor chip.

9. A capacitor-equipped semiconductor device comprising:
a semiconductor chip having a plurality of electrode terminals;
a sheet-like substrate having at least a film capacitor; and
a mounting substrate provided on one side thereof with chip connection terminals disposed to correspond to the electrode terminals of the semiconductor chip and a ground terminal disposed to correspond to one electrode terminal of the film capacitor of the sheet-like substrate, the mounting substrate being provided on an other surface thereof with an external connection terminal connected to the chip connection terminals and the ground terminal and used to mount the mounting substrate on an external substrate, wherein:

the sheet-like substrate is interposed between the semiconductor chip and the mounting substrate, the electrode terminals of the semiconductor chip are connected to the chip connection terminals, the one electrode terminal of the film capacitor is connected to the ground terminal, and an other electrode terminal is connected to a predetermined electrode terminal of the electrode terminals of the semiconductor chip, and the sheet-like substrate is provided on both sides thereof with the film capacitors.

* * * * *